(12) United States Patent
Kim et al.

(10) Patent No.: US 8,050,111 B2
(45) Date of Patent: Nov. 1, 2011

(54) DATA STROBE SIGNAL GENERATING CIRCUIT CAPABLE OF EASILY OBTAINING VALID DATA WINDOW

(75) Inventors: Yong Mi Kim, Cheongiu-si (KR); Yong Gu Kang, Cheongiu-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 421 days.

(21) Appl. No.: 12/319,106

(22) Filed: Dec. 31, 2008

(65) Prior Publication Data
US 2009/0244994 A1    Oct. 1, 2009

(30) Foreign Application Priority Data
Mar. 28, 2008    (KR) .................. 10-2008-0029354

(51) Int. Cl.
*G11C 7/06* (2006.01)
(52) U.S. Cl. .......... 365/189.07; 365/185.23; 365/230.06
(58) Field of Classification Search ............... 365/189.07
See application file for complete search history.

(56) References Cited

U.S. PATENT DOCUMENTS
7,068,549 B2   6/2006   Cho
2008/0094918 A1*  4/2008  Fujizoe ................... 365/189.07

FOREIGN PATENT DOCUMENTS
| KR | 10-2004-0082869 A | 9/2004 |
| KR | 10-2005-0067542 A | 7/2005 |
| KR | 10-2005-0067813 A | 7/2005 |
| KR | 10-2005-0101864 A | 10/2005 |

* cited by examiner

*Primary Examiner* — Jason Lappas
(74) *Attorney, Agent, or Firm* — John P. White; Cooper & Dunham LLP

(57) ABSTRACT

A data strobe signal generating circuit includes a pre-driver control unit for selectively transferring a ground voltage and a supply voltage, as a first control signal and a second control signal, in response to first and second clock pulse signals, wherein the second control signal is driven in response to a preamble signal, a pre-driver for generating a driving signal in response to the first and second control signals and the preamble signal, and an output buffer for driving an output pad in response to the driving signal.

20 Claims, 2 Drawing Sheets

DATA STROBE SIGNAL GENERATING CIRCUIT CAPABLE OF EASILY OBTAINING VALID DATA WINDOW

TECHNICAL FIELD

The present disclosure relates to a semiconductor memory device and, more particularly, to a data strobe signal generating circuit capable of guaranteeing a valid data window of a data strobe signal.

BACKGROUND

With increase of integration in semiconductor memory devices, a working speed thereof has also been improved. Synchronous memory devices, which operate in synchronization with an external clock signal from an external circuit, have been developed in order to improve the operating speed.

SDR (single data rate) synchronous memory devices, in which data are output through data pads in synchronization with a rising edge of a clock signal, were first proposed.

However, SDR synchronous memory devices are not sufficient to satisfy the required performance in the high-speed system. Accordingly, DDR (double data rate) synchronous memory devices have been proposed. In DDR synchronous memory devices, data are output through data pads in synchronization with rising and falling edges of a clock signal.

Since two data are sequentially output through data pads in synchronization with both a rising edge and a falling edge of a clock signal from an external circuit in DDR (double data rate) synchronous memory devices, band width of data in DDR synchronous memory devices can be as wide as twice that of SDR synchronous memory devices so that the DDR synchronous memory devices make it possible to implement a high-speed operation.

However, since DDR synchronous memory devices receive and output two data within one period of a clock signal, an access method which has been used in SDR synchronous memory devices cannot be applied effectively to DDR synchronous memory devices.

When the period of a clock signal is approximately 10 nsec, the two data have to be processed below 6 nsec, when the rising and falling time (about 0.5×4=2) and other requirements prescribed in the specification are considered. This processing is not sufficiently carried out in the memory devices. Accordingly, the memory devices receive and output the data in synchronization with the rising and falling edges of the clock signal when the data are input and output from and to an external circuit; however, the data are actually processed in synchronization with only one of the rising and falling edges of the clock signal within the memory device.

Accordingly, a new data I/O (input/output) method is required when the memory device transfers the received data to an inner core region or the memory device transfers the data from the inner core region to an external circuit.

To achieve this I/O method, a data input buffer of the DDR memory device prefetches and aligns two- or four-bit data which are in synchronization with the rising and falling edges of the clock signal and then transfers odd or even data to the inner core region in synchronization with a rising edge of a main clock signal.

Meanwhile, in order to inform a CUP (control unit and processor) or a memory controller of the exact timing of the output data, the memory chip outputs a data strobe signal DQS and an inverted data strobe signal /DQS together with the data signal DQ.

Since the data strobe signal DQS and the inverted data strobe signal /DQS lead the data signal DQ by one clock cycle in the DDR memory device, they are output in synchronization with the clock signal, which is used as the synchronization signal of the data signal DQ, after the data signal DQ is output and a preamble time (tRPRE, Read DQS Preamble time) is ensured.

In the preamble time (or section), the data signal DQ is in a Hi-z state (a half level (½) of a supply voltage), the data strobe signal DQS is at a low level, and the inverted data strobe signal /DQS is at a high level.

The data signal DQ, which is in a Hi-z state, obtains a valid data window faster than the data strobe signal DQS and the inverted data strobe signal /DQS after the termination of the preamble time. The first valid data window of the data signal DQ, which is output after the termination of the preamble time, is wider than that of the data strobe signal DQS and the inverted data strobe signal /DQS. Since the second valid data window is wider than the first valid data window in the data strobe signal DQS and the inverted data strobe signal /DQS, the data eye of the data strobe signal DQS and the inverted data strobe signal /DQS cannot be formed evenly. Particularly, this is conspicuous at a high frequency operation so that the reliability of the semiconductor memory device deteriorates at the high frequency operation.

SUMMARY

In an aspect of the present disclosure, a data strobe signal generating circuit is provided that is capable of obtaining a valid data window of a data strobe signal, by preventing a data strobe signal DQS and an inverted data strobe signal /DQS from being driven to a supply voltage or a ground voltage.

In an embodiment, a data strobe signal generating circuit includes a pre-driver control unit for selectively transferring a ground voltage and a supply voltage, as a first control signal and a second control signal, in response to first and second clock pulse signals, wherein the second control signal is driven in response to a preamble signal, a pre-driver for generating a pull-up and pull-down driving signal in response to the first and second control signals and the preamble signal, and an output buffer for driving an output pad in response to the pull-up and pull-down driving signal.

The pre-driver control unit includes a first transfer gate for transferring the supply voltage, as the second control signal, in response to the first clock pulse signal, a second transfer gate for transferring the ground voltage, as the second control signal, in response to the second clock pulse signal, and a driving unit for driving the second control signal in response to the preamble signal.

The driving unit includes a pull-up element for pull-up driving the second control signal in response to a first level the preamble signal, and a pull-down element for pull-down driving the second control signal in response to a second level the preamble signal.

The pre-driver control unit includes a third transfer gate for transferring the supply voltage, as the first control signal, in response to the first clock pulse signal, and a fourth transfer gate for transferring the ground voltage, as the first control signal, in response to the second clock pulse signal.

The pre-driver includes a voltage level adjusting unit coupled between a supply voltage terminal and a first node for adjusting a voltage level on the first node in response to the preamble signal, and a first driver coupled between the first node and a ground voltage terminal for driving the pull-down driving signal in response to the second control signal.

The voltage level adjusting unit includes a first resistor coupled between the supply voltage terminal and the first node, and a switch in parallel to the first resistor and coupled between the supply voltage terminal and the first node, wherein the switch is turned on in response to the preamble signal.

The switch is a PMOS transistor.

The first driver includes a pull-up element coupled between the first node and a second node for pull-up driving the pull-down driving signal in response to a first level of the second control signal, and a pull-down element coupled between the second node and the ground voltage terminal for pull-down driving the pull-down driving signal in response to a second level of the second control signal.

The pre-driver further includes a second driver coupled between the supply voltage terminal and the ground voltage terminal for driving a pull-up driving signal in response to the first control signal.

The second driver includes a pull-up element coupled between the supply voltage terminal and the second node for pull-up driving the pull-down driving signal in response to the first control signal, and a pull-down element coupled between the second node and the ground voltage terminal for pull-down driving the pull-up driving signal in response to the first control signal.

The output buffer includes a pull-up element for pull-up driving an output pad in response to the pull-up driving signal, and a pull-down element for pull-down driving the output pad in response to the pull-down driving signal.

In another embodiment, a data strobe signal generating circuit includes a pre-driver control unit for selectively transferring a ground voltage and a supply voltage, as a first control signal and a second control signal, in response to first and second clock pulse signals, wherein the first control signal is driven in response to a preamble signal, a pre-driver for generating a pull-up and pull-down driving signal in response to the first and second control signals and the preamble signal, and an output buffer for driving an output pad in response to the pull-up and pull-down driving signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and embodiments of the present disclosure will be described with reference to accompanying drawings. However, the examples and embodiments are for illustrative purposes only and are not intended to limit the scope of the invention.

Figure 1:
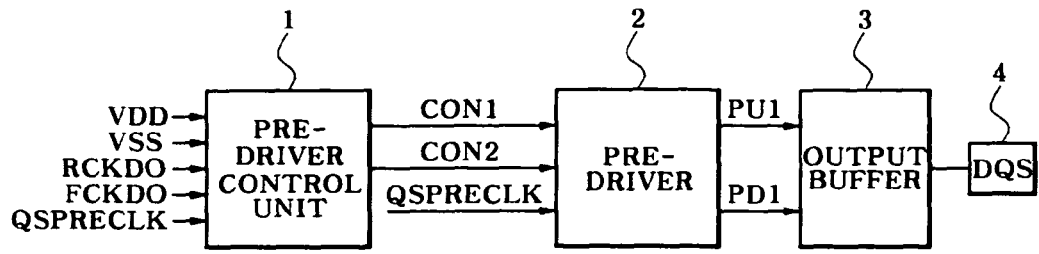
FIG. 1 is block diagram showing an example of a structure of a data strobe signal generating circuit according to an embodiment of the present disclosure.

FIG. 1 is block diagram showing an example of a structure of a data strobe signal generating circuit according to an embodiment of the present disclosure.

Referring to FIG. 1, the data strobe signal generating circuit according to an embodiment of the present disclosure includes a pre-driver control unit 1 which selectively transfers a supply voltage VDD or a ground voltage VSS as a first control signal CON1 or a second control signal CON2, in response to first and second clock pulse signals RCLKDO and FCLKDO, a pre-driver 2 which produces first pull-up and pull-down driving signals PU1 and PD1 in response to the first control signal CON1, the second control signal CON2 and a preamble signal QSPRECLK, and an output buffer 3 which drives a data strobe signal output pad 4 in response to the first pull-up and pull-down driving signals PU1 and PD1. The second control signal CON2 is driven in response to the preamble signal QSPRECLK.

Figure 2:
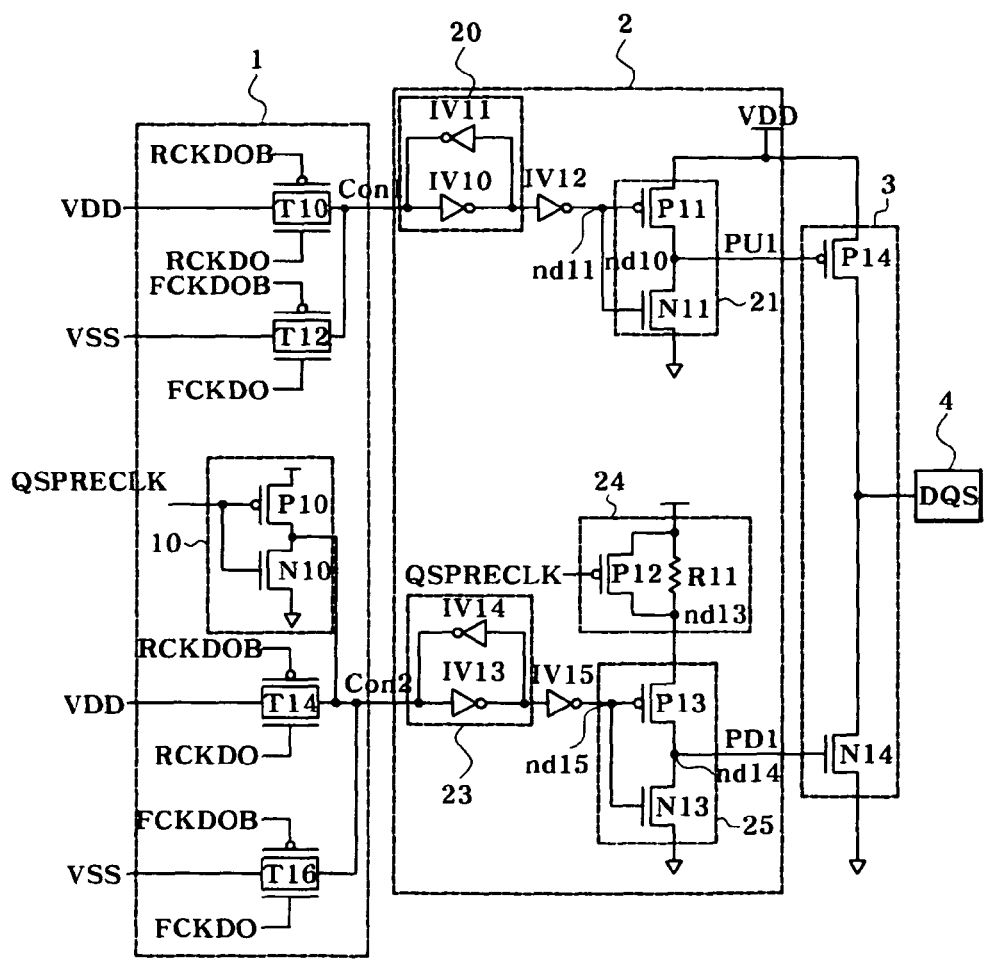
FIG. 2 is a detailed circuit diagram showing an example of a structure of the data strobe signal generating circuit in FIG. 1.

In more detail, the data strobe signal generating circuit according to an embodiment of the present disclosure will be described referring to FIG. 2.

First, the pre-driver control unit 1 includes a transfer gate T10 to transfer the supply voltage VDD, as the first control signal CON1, in response to the first clock pulse signal RCKDO and an inverted first clock pulse signal RCKDOB, a transfer gate T12 to transfer the ground voltage VSS, as the first control signal CON1, in response to the second clock pulse signal FCKDO and an inverted second clock pulse signal FCKDOB, a transfer gate T14 to transfer the supply voltage VDD, as the second control signal CON2, in response to the first clock pulse signal RCKDO and the inverted first clock pulse signal RCKDOB, a transfer gate T16 to transfer the ground voltage VSS, as the second control signal CON2, in response to the second clock pulse signal FCKDO and the inverted second clock pulse signal FCKDOB, and a first driving unit 10 to drive the second control signal CON2 in response to the preamble signal QSPRECLK The first driving unit 10 includes a PMOS transistor P10 for pull-up driving the second control signal CON2 in response to a low level of the preamble signal QSPRECLK and a NMOS transistor N10 for pull-down driving the second control signal CON2 in response to a high level of the preamble signal QSPRECLK.

Here, the first clock pulse signal RCKDO and the second clock pulse signal FCKDO are strobe signals to output the data RDO and SDO. The data RDO and SDO are signals which are generated when the data stored in a memory cell are processed by I/O lines SIO, LIO and GIO and a pipe latch. Further, the preamble signal QSPRECLK is a signal which is enabled at a high level during the preamble section.

Next, the pre-driver 2 includes a first latch 20, a second driving unit 21, a second latch 23, a first voltage level adjusting unit 24, and a third driving unit 25.

The first latch 20 includes inverters IV10 and IV11.

The second driving unit 21 includes a PMOS transistor P11, which is disposed between the supply voltage VDD and a node nd10, for pull-up driving the first pull-up driving signal PU1 in response to a low-level signal on a node nd11, and a NMOS transistor N11, which is disposed between the node nd10 and the ground voltage VSS, for pull-down driving the first pull-up driving signal PU1 in response to a high-level signal on the node nd11.

The second latch 23 includes inverters IV13 and IV14.

The first voltage level adjusting unit 24 includes a resistor R11 connected between the supply voltage VDD and a node nd13, and a PMOS transistor P12 in parallel connected to the resistor R11 which is disposed between the supply voltage VDD and the node nd13.

The third driving unit 25 includes a PMOS transistor P13, which is disposed between the node nd13 and a node nd14, for pull-up driving the first pull-down driving signal PD1 in response to a low-level signal on a node nd15, and a NMOS transistor N13, which is disposed between the node nd14 and the ground voltage VSS, for pull-down driving the first pull-down driving signal PD1 in response to a high-level signal on the node nd15.

Next, the output buffer 3 includes a PMOS transistor P14 for pull-up driving the data strobe signal output pad 4 in response to the first pull-up driving signal PU1 and a NMOS transistor N14 for pull-down driving the data strobe signal output pad 4 in response to the first pull-down driving signal PD1.

The operations of the data strobe signal generation circuit will be described and the operations will be described in two sections, i.e., after the entry of the preamble section and after the termination of the preamble.

First, if the semiconductor memory device enters the preamble section, the preamble signal QSPRECLK is at a high level. At this time, the first clock pulse signal RCKDO and the second clock pulse signal FCKDO are not input. Accordingly, the second control signal CON2 is produced at a low level due to the preamble signal QSPRECLK of the high level and the PMOS transistor P13, which is turned on, pull-up drives the first pull-down driving signal PD1.

At this time, in contrast to conventional technology, the driving force to pull-up drive the first pull-down driving signal PD1 of the data strobe signal generating circuit in this embodiment of the present disclosure becomes low. In more detail, the voltage level of the supply voltage VDD, which drops through the resistor R11 due to the preamble signal QSPRECLK of the high level, is provided to the PMOS transistor P13. Accordingly, the turn-on strength of the PMOS transistor P13 is weak due to the voltage drop. As a result, the first pull-down driving signal PD1 is pull-up driven at a voltage level which is lower than the supply voltage VDD.

The data strobe signal output pad 4, which is pull-down driven by the first pull-down driving signal PD1 that is not pull-up driven up to the supply voltage VDD, produces the data strobe signal DQS which is driven to a voltage level that is higher than the ground voltage VSS.

To sum up, the data strobe signal DQS, which is produced by the data strobe signal generating circuit according to an embodiment of the present disclosure, is pull-down driven at a voltage level which is higher than the ground voltage VSS.

Next, after the termination of the preamble section, the preamble signal QSPRECLK transits from a high level to a low level and a read operation starts with the input of the first clock pulse signal RCKDO and the second clock pulse signal FCKDO.

In the case where the first clock pulse signal RCKDO is input at a high level, since the transfer gates T10 and T14 are turned on and the transfer gates T12 and T16 are turned off, each of the first and second control signals CON1 and CON2 is at a high level. Since the first and second control signals CON1 and CON2 of the high level turn on the NMOS transistors N11 and N13, respectively, the first pull-up signal PU1 and the first pull-down signal PD1 are pull-down driven to a low level. Accordingly, the PMOS transistor P14 is turned on so that the data strobe signal DQS is pull-up driven to the supply voltage VDD.

At this time, since the data strobe signal DQS is set up to a voltage level, which is higher than the ground voltage VSS, in the preamble section, the data strobe signal generating circuit according to an embodiment of the present disclosure makes the data strobe signal DQS pull-up driven easily to the supply voltage VDD in the preamble section, as compared with the conventional data strobe signal generating circuit to set up the data strobe signal DQS to the ground voltage VSS. That is, since the data strobe signal DQS is fast driven to the supply voltage VDD, the first valid data window becomes wider. As a result, the data eye of the data strobe signal DQS can be evenly formed.

Figure 3:
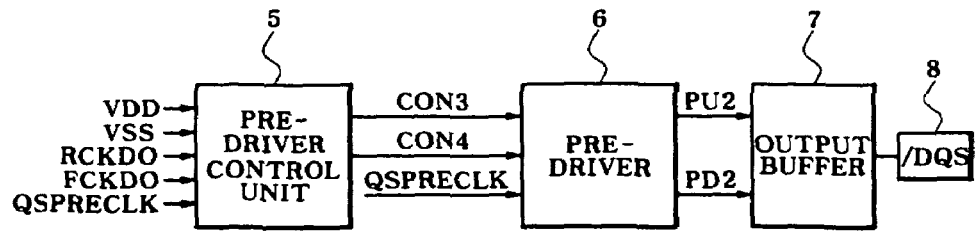
FIG. 3 is block diagram showing an example of a structure of an inverted data strobe signal generating circuit according to an embodiment of the present disclosure.
Figure 4:
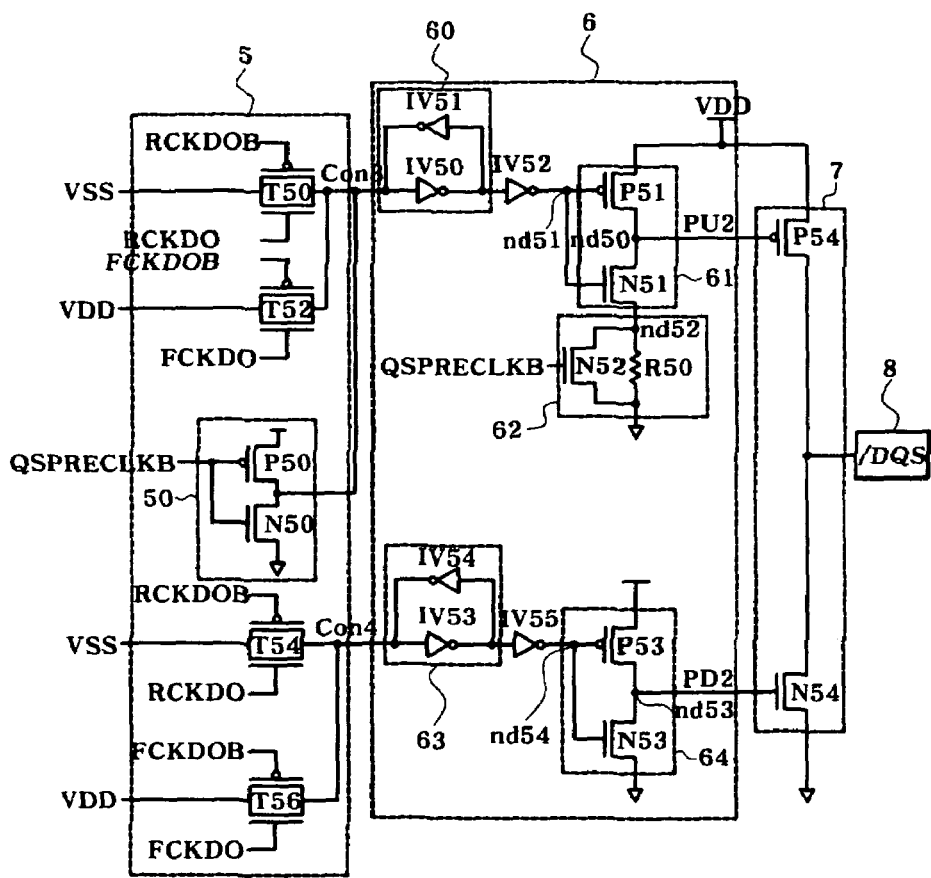
FIG. 4 is a detailed circuit diagram showing an example of a structure of the inverted data strobe signal generating circuit in FIG. 3.

FIG. 3 is a block diagram showing an example of a structure of an inverted data strobe signal generating circuit according to an embodiment of the present disclosure and FIG. 4 is a detailed circuit diagram showing an example of a structure of the inverted data strobe signal generating circuit in FIG. 3.

Referring to FIG. 3, the inverted data strobe signal generating circuit according to an embodiment of the present disclosure includes a pre-driver control unit 5 which selectively transfers a supply voltage VDD or a ground voltage VSS as a third control signal CON3 or a fourth control signal CON2, in response to first and second clock pulse signals RCLKDO and FCLKDO, a pre-driver 6 which produces second pull-up and pull-down driving signals PU2 and PD2 in response to the third control signal CON3, the fourth control signal CON4 and a preamble signal QSPRECLK, and an output buffer 7 which drives an inverted data strobe signal output pad 8 in response to the second pull-up and pull-down driving signals PU2 and PD2. The third control signal CON3 is driven in response to the preamble signal QSPRECLK.

In more detail, the inverted data strobe signal generating circuit according to an embodiment of the present disclosure will be described referring to FIG. 4.

First, the pre-driver control unit 5 includes a transfer gate T50 to transfer the ground voltage VSS, as the third control signal CON3, in response to the first clock pulse signal RCKDO and an inverted first clock pulse signal RCKDOB, a transfer gate T52 to transfer the supply voltage VDD, as the third control signal CON3, in response to the second clock pulse signal FCKDO and the inverted second clock pulse signal FCKDOB, a transfer gate T54 to transfer the ground voltage VSS, as the fourth control signal CON4, in response to the first clock pulse signal RCKDO and the inverted second clock pulse signal RCKDOB, a transfer gate T56 to transfer the supply voltage VDD, as the fourth control signal CON4, in response to the second clock pulse signal FCKDO and the inverted second clock pulse signal FCKDOB, and a fourth driving unit 50 to drive the third control signal CON3 in response to the preamble signal QSPRECLK The fourth driving unit 50 includes a PMOS transistor P50 for pull-up driving the third control signal CON3 in response to a low level of an inverted preamble signal QSPRECLKB and a NMOS transistor N50 for pull-down driving the third control signal CON3 in response to a high level of the inverted preamble signal QSPRECLKB.

Here, the inverted preamble signal QSPRECLKB is a signal which is enabled at a low level during the preamble section.

Next, the pre-driver 6 includes a third latch 60, a fifth driving unit 61, a second voltage level adjusting unit 62, a fourth latch 63, and a sixth driving unit 64.

The third latch 60 includes inverters IV50 and IV51.

The fifth driving unit 61 includes a PMOS transistor P51, which is disposed between the supply voltage VDD and a node nd50, for pull-up driving the second pull-up driving signal PU2 in response to a signal on a node nd51, and a NMOS transistor N51, which is disposed between the nodes nd50 and nd52, for pull-down driving the second pull-up driving signal PU2 in response to the signal on the node nd51.

The second voltage level adjusting unit 62 includes a resistor R50 connected between the node nd52 and the ground voltage VSS and a NMOS transistor N52 in parallel connected to the resistor R50 and is turned on in response to the inverted preamble signal QSPRECLKB.

The fourth latch 63 includes inverters IV53 and IV54.

The sixth driving unit 64 includes a PMOS transistor P53, which is disposed between the supply voltage VDD and a node nd53, for pull-up driving the second pull-down driving signal PD2 in response to a low-level signal on a node nd54, and a NMOS transistor N53, which is disposed between the node nd53 and the ground voltage VSS, for pull-down driving the second pull-down driving signal PD2 in response to a high-level signal on the node nd54.

Next, the output buffer 7 includes a PMOS transistor P54 for pull-up driving the inverted data strobe signal output pad 8 in response to the second pull-up driving signal PU2 and a NMOS transistor N54 for pull-down driving the inverted data strobe signal output pad 8 in response to the second pull-down driving signal PD2.

The operations of the inverted data strobe signal generation circuit will be described and the operations will be described in two sections, i.e., after the entry of the preamble section and after the termination of the preamble.

First, if the semiconductor memory device enters the preamble section, the inverted preamble signal QSPRECLKB is at a low level. At this time, the first clock pulse signal RCKDO and the second clock pulse signal FCKDO are not input. Accordingly, the third control signal CON3 is pull-up driven to a high level by the PMOS transistor P50 which is turned on by the inverted preamble signal QSPRECLKB. The third control signal CON3 of the high level turns on the NMOS transistor N51 in the fifth driving unit 61 so that the second pull-up driving signal PU2 is pull-down driven.

At this time, in contrast to conventional technology, the driving force to pull-down drive the second pull-up driving signal PU2 of the inverted data strobe signal generating circuit in this embodiment of the present disclosure becomes low. In more detail, the voltage level of the node nd52 is higher than the ground voltage due to the resistor R50 which operates through the NMOS transistor N52 that is turned off in response to the inverted preamble signal QSPRECLKB of the low level. Accordingly, the turn-on strength of the NMOS transistor P51 is weak when it is connected to the node nd52, as compared with that when it is directly connected to the ground voltage VSS. As a result, the second pull-up driving signal PU2 is pull-down driven at a voltage level which is higher than the ground voltage VSS.

The inverted data strobe signal output pad 8, which is pull-up driven by the second pull-up driving signal PU2 that is not pull-down driven up to the ground voltage VSS, produces an inverted data strobe signal /DQS which is driven to a voltage level that is lower than the supply voltage VDD.

To sum up, the inverted data strobe signal /DQS, which is produced by the inverted data strobe signal generating circuit according to an embodiment of the present disclosure, is pull-up driven at a voltage level which is lower than the supply voltage VDD.

Next, after the termination of the preamble section, the inverted preamble signal QSPRECLKB transits from a low level to a high level and a read operation starts with the input of the first clock pulse signal RCKDO and the second clock pulse signal FCKDO.

In the case where the first clock pulse signal RCKDO is input at a high level, since the transfer gates T50 and T54 are turned on and the transfer gates T52 and T56 are turned off, each of the third and fourth control signals CON3 and CON4 is at a low level. Since the third and fourth control signals CON3 and CON4 of the low level turn on the PMOS transistors P51 and P53, the second pull-up signal PU2 and the second pull-down signal PD2 are pull-up driven to a high level. Accordingly, the NMOS transistor N54 is turned on so that the inverted data strobe signal /DQS is pull-down driven to the ground voltage VSS.

At this time, since the inverted data strobe signal /DQS is set up to a voltage level, which is lower than the supply voltage VSS, in the preamble section, the inverted data strobe signal generating circuit according to an embodiment of the present disclosure makes the inverted data strobe signal /DQS pull-down driven easily to the ground voltage VSS in the preamble section, as compared with the conventional data strobe signal generating circuit to set up the inverted data strobe signal /DQS to the supply voltage VDD. That is, since the inverted data strobe signal /DQS is fast driven to the ground voltage VSS, the first valid data window becomes wider. As a result, the data eye of the inverted data strobe signal /DQS can be evenly formed.

Although examples and embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application number 10-2008-0029354, filed on Mar. 28, 2008, the entire contents of which are incorporated herein by reference.

What is claimed is:

1. A data strobe signal generating circuit comprising:
   a pre-driver control unit for selectively transferring a ground voltage or a supply voltage to a first control signal and a second control signal, in response to first and second clock pulse signals, wherein the second control signal is driven in response to a preamble signal being enabled during a preamble section;
   a pre-driver for generating a pull-up and pull-down driving signal in response to the first and second control signals and the preamble signal; and
   an output buffer for driving an output pad in response to the pull-up and pull-down driving signal.

2. The data strobe signal generating circuit of claim 1, wherein the pre-driver control unit includes:
   a first transfer gate for transferring the supply voltage, as the second control signal, in response to the first clock pulse signal;
   a second transfer gate for transferring the ground voltage, as the second control signal, in response to the second clock pulse signal; and
   a driving unit for driving the second control signal in response to the preamble signal.

3. The data strobe signal generating circuit of claim 2, wherein the driving unit includes:
   a pull-up element for pull-up driving the second control signal in response to a first level of the preamble signal; and
   a pull-down element for pull-down driving the second control signal in response to a second level of the preamble signal.

4. The data strobe signal generating circuit of claim 2, wherein the pre-driver control unit includes:
   a third transfer gate for transferring the supply voltage, as the first control signal, in response to the first clock pulse signal; and a fourth transfer gate for transferring the ground voltage, as the first control signal, in response to the second clock pulse signal.

5. The data strobe signal generating circuit of claim 1, wherein the pre-driver includes:
   a voltage level adjusting unit coupled between a supply voltage terminal and a first node for adjusting a voltage level on the first node in response to the preamble signal; and
   a first driver coupled between the first node and a ground voltage terminal for driving the pull-down driving signal in response to the second control signal.

6. The data strobe signal generating circuit of claim 5, wherein the voltage level adjusting unit includes:
   a first resistor coupled between the supply voltage terminal and the first node; and
   a switch coupled between the supply voltage terminal and the first node in parallel to the first resistor, wherein the switch is turned on in response to the preamble signal.

7. The data strobe signal generating circuit of claim 6, wherein the switch is a PMOS transistor.

8. The data strobe signal generating circuit of claim 5, wherein the first driver includes:
   a pull-up element coupled between the first node and a second node for pull-up driving the pull-down driving signal in response to a first level of the second control signal; and
   a pull-down element coupled between the second node and the ground voltage terminal for pull-down driving the pull-down driving signal in response to a second level of the second control signal.

9. The data strobe signal generating circuit of claim 5, wherein the pre-driver further includes a second driver coupled between the supply voltage terminal and the ground voltage terminal for driving a pull-up driving signal in response to the first control signal.

10. The data strobe signal generating circuit of claim 9, wherein the second driver includes:
    a pull-up element coupled between the supply voltage terminal and a second node for pull-up driving the pull-down driving signal in response to a first level of the first control signal; and
    a pull-down element coupled between the second node and the ground voltage terminal for pull-down driving the pull-up driving signal in response to a second level of the first control signal.

11. The data strobe signal generating circuit of claim 1, wherein the output buffer includes:
    a pull-up element for pull-up driving an output pad in response to the pull-up driving signal; and
    a pull-down element for pull-down driving the output pad in response to the pull-down driving signal.

12. A data strobe signal generating circuit comprising:
    a pre-driver control unit for selectively transferring a ground voltage and a supply voltage, as a first control signal and a second control signal, in response to first and second clock pulse signals, wherein the first control signal is driven in response to a preamble signal;
    a first driver coupled between a supply voltage terminal and a first node for driving a pull-up driving signal in response to the first control signal;
    a voltage level adjusting unit coupled between the first node and a ground voltage terminal for adjusting a voltage level on the first node in response to the preamble signal;
    a second driver coupled between the supply voltage terminal and the ground voltage terminal for driving a pull-down driving signal in response to the second control signal; and
    an output buffer for driving an output pad in response to the pull-up and pull-down driving signal.

13. The data strobe signal generating circuit of claim 12, wherein the pre-driver control unit includes:
    a first transfer gate for transferring the supply voltage, as the first control signal, in response to the first clock pulse signal;
    a second transfer gate for transferring the ground voltage, as the first control signal, in response to the second clock pulse signal; and
    a driving unit for driving the first control signal in response to the preamble signal.

14. The data strobe signal generating circuit of claim 13, wherein the driving unit includes:
    a pull-up element for pull-up driving the first control signal in response to a first level of the preamble signal; and
    a pull-down element for pull-down driving the first control signal in response to a second level of the preamble signal.

15. The data strobe signal generating circuit of claim 13, wherein the pre-driver control unit includes:
    a third transfer gate for transferring the supply voltage, as the second control signal, in response to the first clock pulse signal; and
    a fourth transfer gate for transferring the ground voltage, as the second control signal, in response to the second clock pulse signal.

16. The data strobe signal generating circuit of claim 12, wherein the first driver includes:
    a pull-up element coupled between the supply voltage terminal and a second node through which the pull-up driving signal is output for pull-up driving the second node in response to a first level of the first control signal; and
    a pull-down element coupled between the first node and the second node for pull-down driving the second node in response to a second level of the first control signal.

17. The data strobe signal generating circuit of claim 12, wherein the voltage level adjusting unit includes:
    a first resistor coupled between the first node and the ground voltage terminal; and
    a switch in parallel to the first resistor and coupled between the first node and the ground voltage terminal, wherein the switch is turned on in response to the preamble signal.

18. The data strobe signal generating circuit of claim 17, wherein the switch is a NMOS transistor.

19. The data strobe signal generating circuit of claim 12, wherein the second driver includes:
    a pull-up element coupled between the supply voltage terminal and the second node for pull-up driving the pull-down driving signal in response to the second control signal; and
    a pull-down element coupled between the second node and the ground voltage terminal for pull-down driving the pull-up driving signal in response to the second control signal.

20. The data strobe signal generating circuit of claim 12, wherein the output buffer includes:
    a pull-up element for pull-up driving an output pad in response to the pull-up driving signal; and
    a pull-down element for pull-down driving the output pad in response to the pull-down driving signal.

* * * * *